US011107762B2

(12) United States Patent
Moon et al.

(10) Patent No.: US 11,107,762 B2
(45) Date of Patent: Aug. 31, 2021

(54) SEMICONDUCTOR PACKAGE

(71) Applicant: SAMSUNG ELECTRONICS CO., LTD., Suwon-si (KR)

(72) Inventors: So Yeon Moon, Suwon-si (KR); Ji Hye Shim, Suwon-si (KR); Seung Hun Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 16/662,404

(22) Filed: Oct. 24, 2019

(65) Prior Publication Data

US 2020/0135633 A1 Apr. 30, 2020

(30) Foreign Application Priority Data

Oct. 25, 2018 (KR) .................. 10-2018-0128063

(51) Int. Cl.
| | |
|---|---|
| *H01L 29/94* | (2006.01) |
| *H01L 21/44* | (2006.01) |
| *H01L 23/498* | (2006.01) |
| *H01L 23/48* | (2006.01) |
| *H01L 23/31* | (2006.01) |

(52) U.S. Cl.
CPC .... *H01L 23/49861* (2013.01); *H01L 23/3114* (2013.01); *H01L 23/481* (2013.01); *H01L 2224/0233* (2013.01)

(58) Field of Classification Search
CPC ......... H01L 23/49891; H01L 21/67336; H01L 21/67343

USPC .................. 438/255, 398, 665, 964; 257/309
See application file for complete search history.

(56) References Cited

U.S. PATENT DOCUMENTS

| | | | | |
|---|---|---|---|---|
| 6,204,454 | B1 * | 3/2001 | Gotoh | H01L 23/10 |
| | | | | 156/153 |
| 9,351,402 | B2 * | 5/2016 | Yoshioka | H01L 23/49811 |
| 10,586,756 | B2 * | 3/2020 | Roth | H01L 23/49513 |
| 10,811,352 | B2 * | 10/2020 | Jeong | H01L 23/544 |
| 2013/0058062 | A1 | 3/2013 | Tachibana et al. | |
| 2018/0082933 | A1 | 3/2018 | Ko et al. | |

FOREIGN PATENT DOCUMENTS

| | | |
|---|---|---|
| KR | 10-2013-0079404 A | 7/2013 |
| KR | 10-2018-0032148 A | 3/2018 |

* cited by examiner

*Primary Examiner* — Calvin Lee
(74) *Attorney, Agent, or Firm* — Sughrue Mion, PLLC

(57) ABSTRACT

A semiconductor package includes a semiconductor chip having an active surface on which a connection pad is disposed and an inactive surface opposing the active surface, and a first encapsulant covering at least a portion of each of the inactive surface and a side surface of the semiconductor chip. A metal layer is disposed on the first encapsulant, and includes a first conductive layer and a second conductive layer, sequentially stacked. A connection structure is disposed on the active surface of the semiconductor chip, and includes a first redistribution layer electrically connected to the connection pad. A lower surface of the first conductive layer is in contact with the first encapsulant and has first surface roughness, and an upper surface of the first conductive layer is in contact with the second conductive layer and has second surface roughness smaller than the first surface roughness.

20 Claims, 20 Drawing Sheets

I-I'

SEMICONDUCTOR PACKAGE

CROSS-REFERENCE TO RELATED APPLICATION(S)

This application claims benefit of priority to Korean Patent Application No. 10-2018-0128063 filed on Oct. 25, 2018 in the Korean Intellectual Property Office, the disclosure of which is incorporated herein by reference in its entirety.

BACKGROUND

1. Field

The present disclosure relates to a semiconductor chip, for example, to a fan-out semiconductor package.

2. Description of Related Art

Semiconductor packages are continuously pursuing light, thin, short, and small shapes in terms of design, and pursuing a System in Package (SiP) structure which provides complexity and versatility in terms of functionality. To this end, a plurality of chips and components are mounted in a single package, and thus there is growing interest in techniques for shielding electromagnetic wave interference between components and for improving a heat dissipation function. In addition, a wiring structure for stacking packages is also used.

Particularly, when a metal layer is disposed in an upper portion of a semiconductor chip for EMI shielding, heat dissipation, wiring, or the like, it is common to form a chemical copper layer after removing a carrier from an encapsulant of a semiconductor chip. In this case, there may be problems in that adhesion between an encapsulant and a chemical copper layer is degraded, and a process becomes complicated.

SUMMARY

An aspect of the present disclosure is to provide a semiconductor package in which adhesion between a metal layer and an encapsulant is improved in an upper portion of a semiconductor chip, and to provide a method of manufacturing the semiconductor package using a simplified process.

According to an aspect of the present disclosure, in a semiconductor package, a metal layer is formed using a first conductive layer on an encapsulant having surface roughness.

For example, a semiconductor package includes a semiconductor chip having an active surface on which a connection pad is disposed and an inactive surface opposing the active surface, and a first encapsulant covering at least a portion of each of the inactive surface and a side surface of the semiconductor chip. A metal layer is disposed on the first encapsulant, and includes a first conductive layer and a second conductive layer, sequentially stacked. A connection structure is disposed on the active surface of the semiconductor chip, and includes a first redistribution layer electrically connected to the connection pad. A lower surface of the first conductive layer is in contact with the first encapsulant and has first surface roughness, and an upper surface of the first conductive layer is in contact with the second conductive layer and has second surface roughness smaller than the first surface roughness.

In accordance with another aspect of the disclosure, a semiconductor package may include a semiconductor chip having an active surface on which a connection pad is disposed and an inactive surface opposing the active surface, and an encapsulant covering at least a portion of each of the inactive surface and a side surface of the semiconductor chip. A metal layer is disposed on the encapsulant, has at least a portion extended to overlap an upper portion of the semiconductor chip, and has a first conductive layer and a second conductive layer that are sequentially stacked. A via passes through a portion of the encapsulant and connects to the metal layer, and a connection structure is disposed on the active surface of the semiconductor chip and includes a redistribution layer electrically connected to the connection pad. A lower surface of the first conductive layer is in contact with the encapsulant and has roughness along a surface of the encapsulant, and an upper surface of the first conductive layer is in contact with the second conductive layer and is flat.

In accordance with a further aspect of the disclosure, a semiconductor package may include a semiconductor chip having an active surface on which a connection pad is disposed and an inactive surface opposing the active surface, and an encapsulant covering at least a portion of each of the inactive surface and a side surface of the semiconductor chip. A metal layer is disposed on the encapsulant, and includes a first conductive layer and a second conductive layer, sequentially stacked in direct contact with each other. A connection structure is disposed on the active surface of the semiconductor chip, and includes a first redistribution layer electrically connected to the connection pad. Each of the first and second conductive layers extends to overlap, in a stacking direction of the semiconductor chip on the connection structure, with an entire upper surface of the semiconductor chip.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
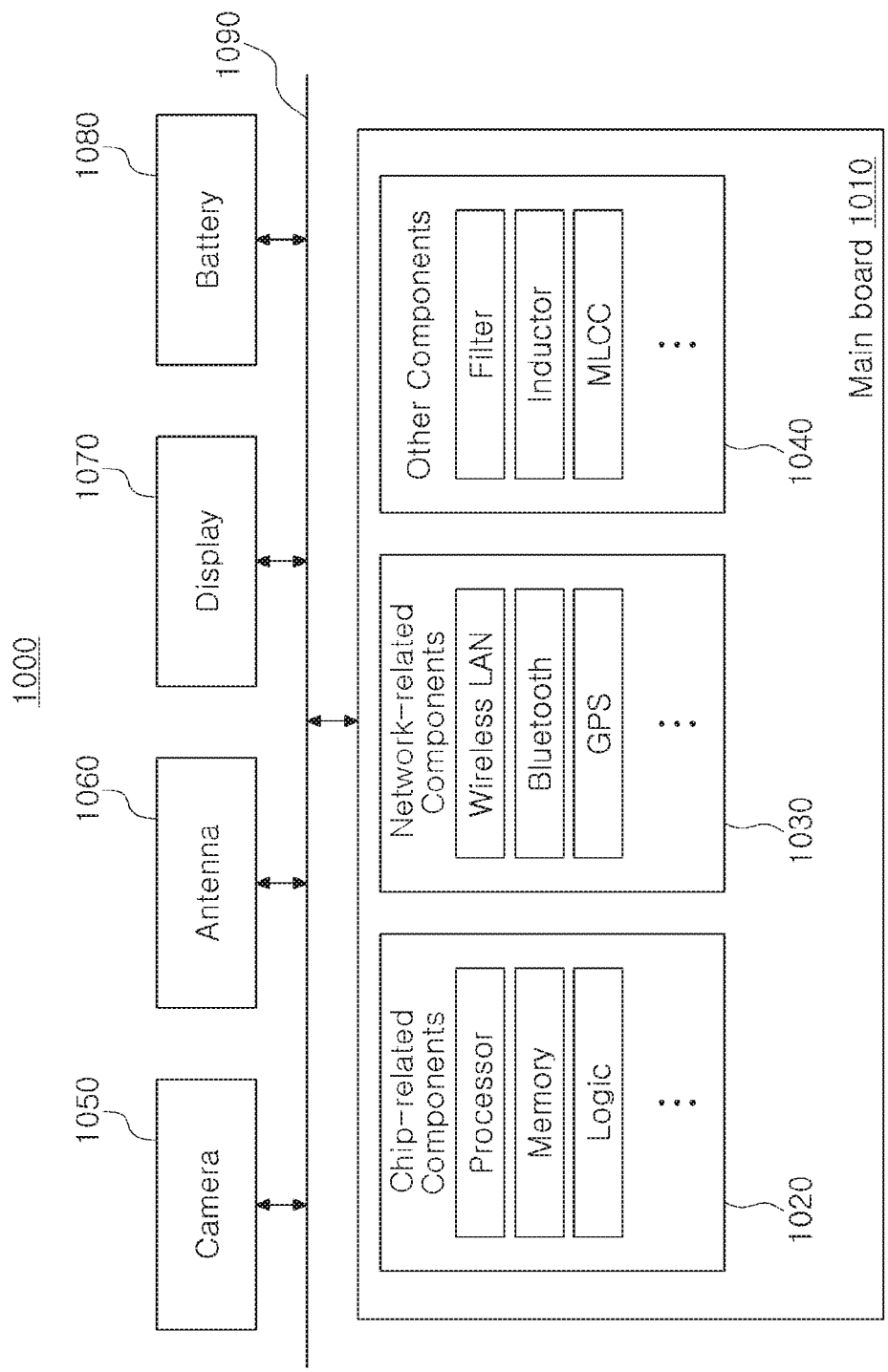
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only an illustrative configuration herein, but are not limited thereto.

Electronic Device

FIG. 1 is a schematic block diagram illustrating an example of an electronic device system.

Referring to FIG. 1, an electronic device 1000 may receive a motherboard 1010. The mother board 1010 may include chip related components 1020, network related components 1030, other components 1040, or the like, physically or electrically connected thereto. These components may be connected to others to be described below to form various signal lines 1090.

The chip associated components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip associated components 1020 are not limited thereto, and may include other types of chip associated components. In addition, the chip-associated components 1020 may be combined with each other.

The network associated components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network associated components 1030 are not limited thereto, but may also include a variety of other wireless or wired standards or protocols. In addition, the network associated components 1030 may be combined with each other, together with the chip associated components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
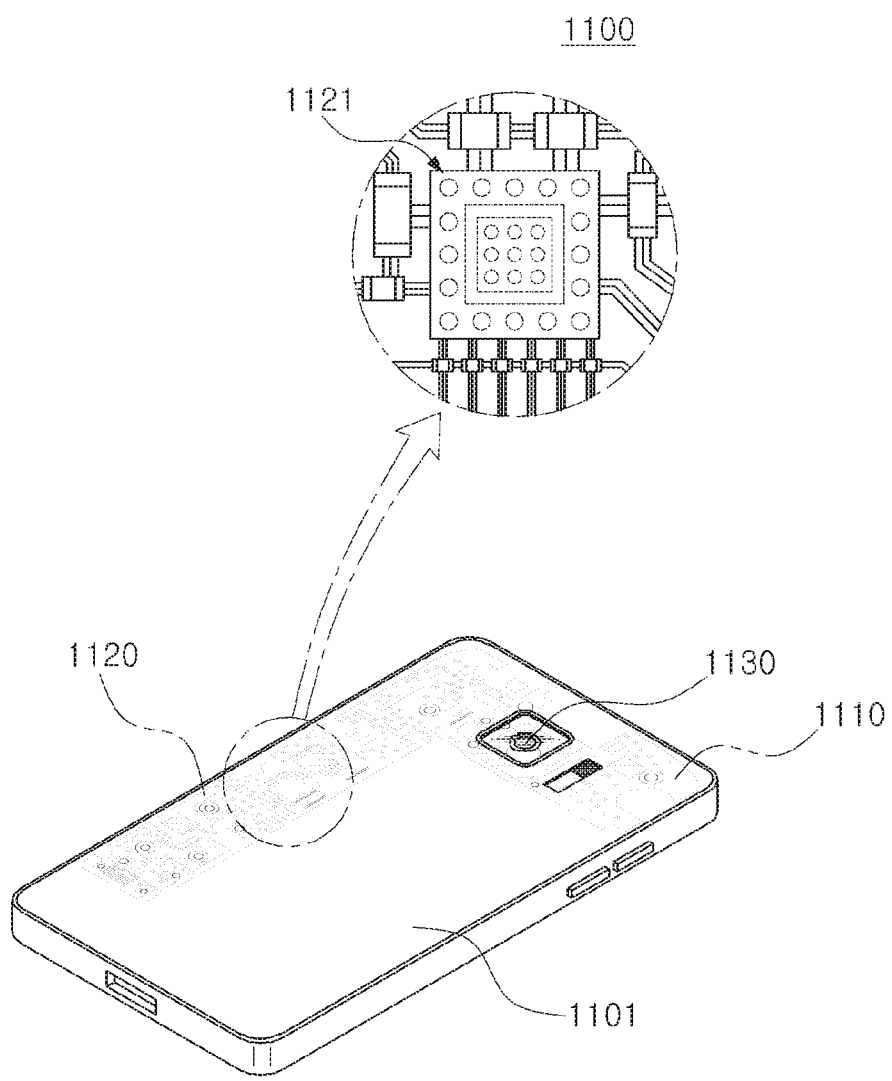
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is used due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
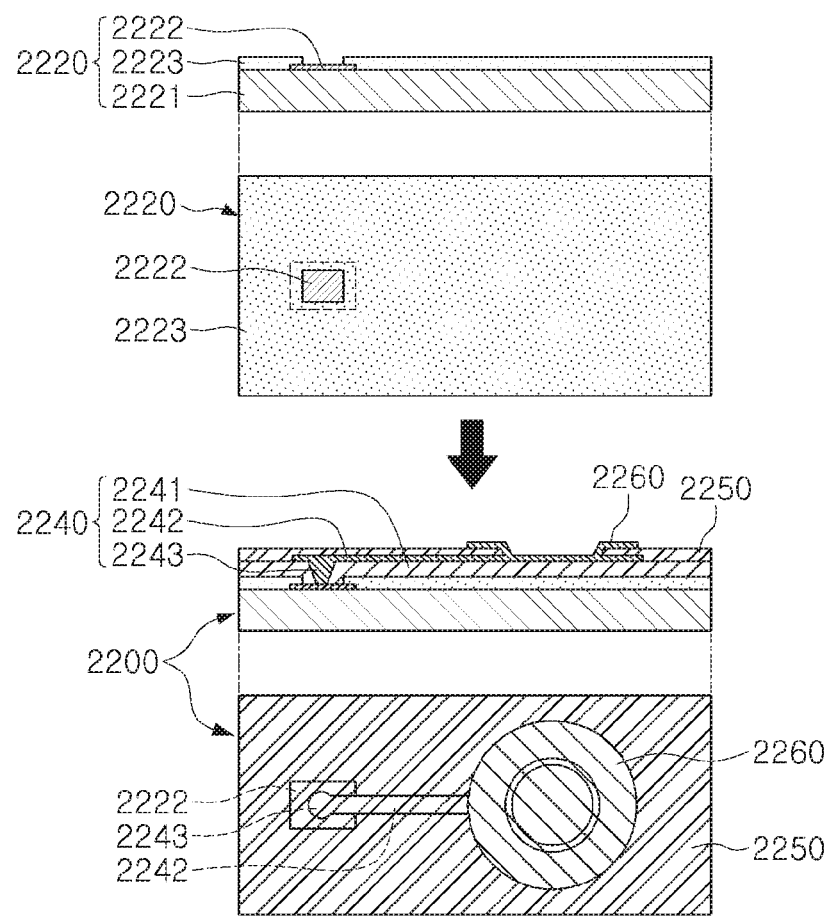
FIGS. 3A and 3B are schematic cross-sectional views illustrating a fan-in semiconductor package before and after being packaged.
Figure 3B:
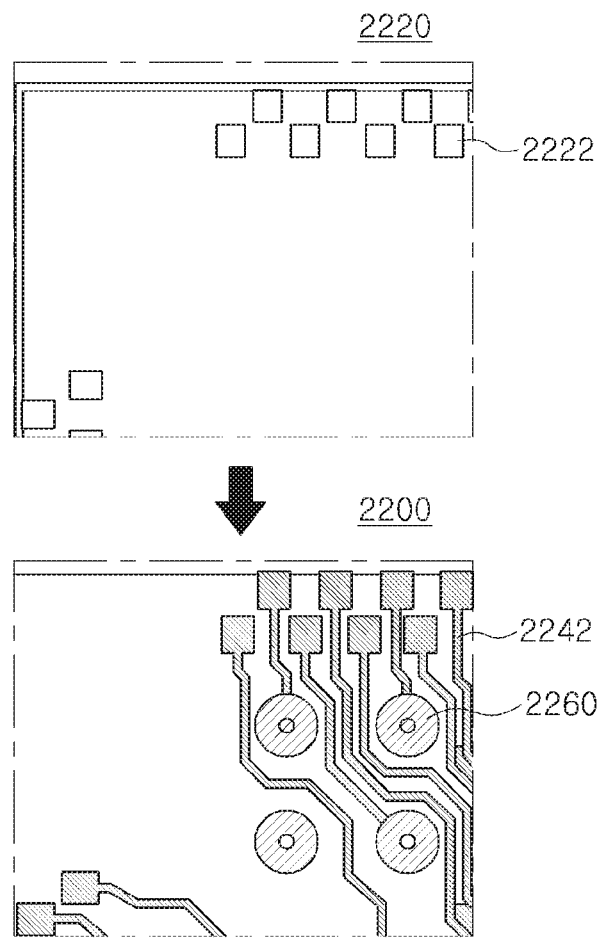

FIGS. 3A and 3B are schematic cross-sectional views illustrating states of a fan-in semiconductor package before and after being packaged.

Figure 4:
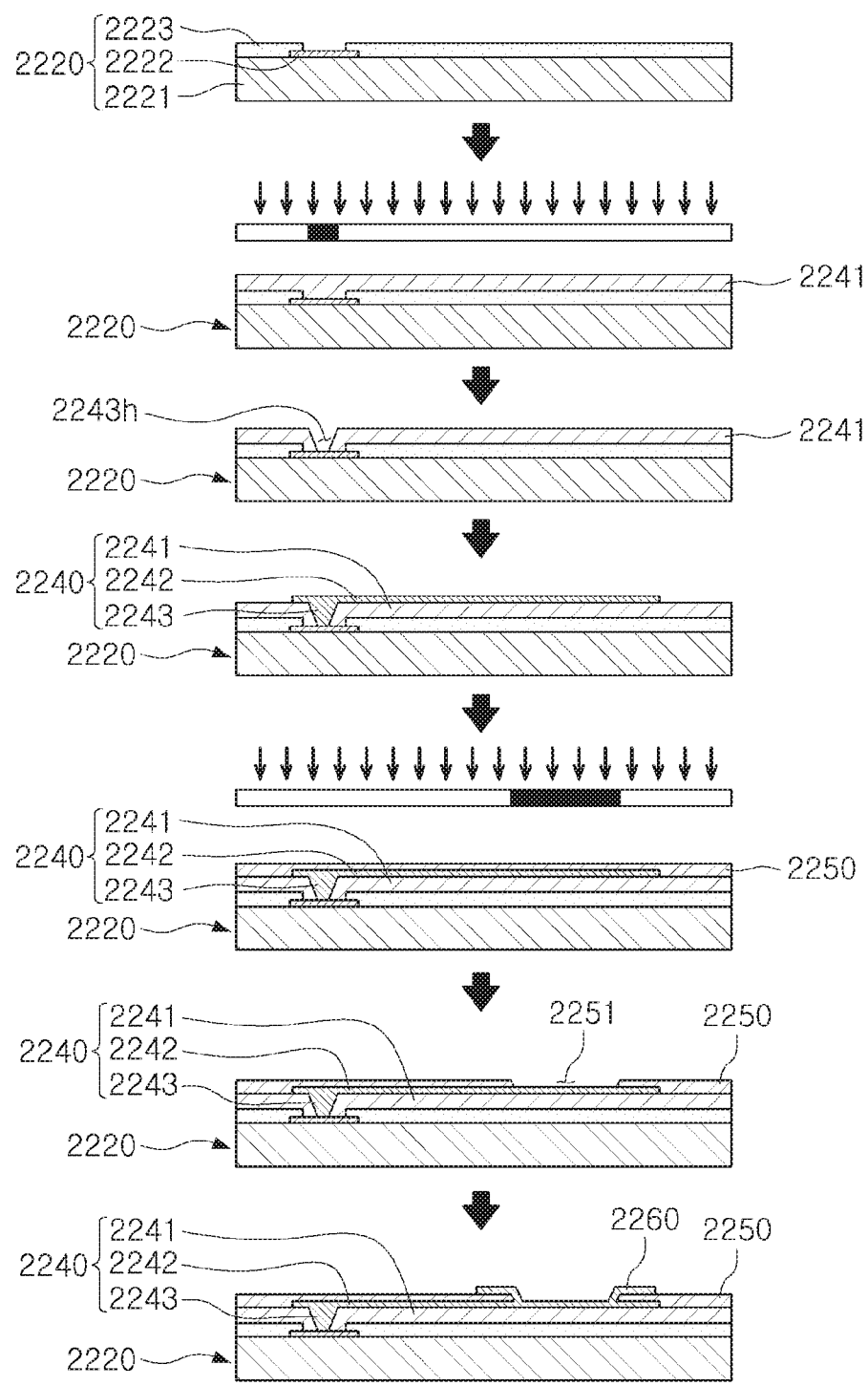
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
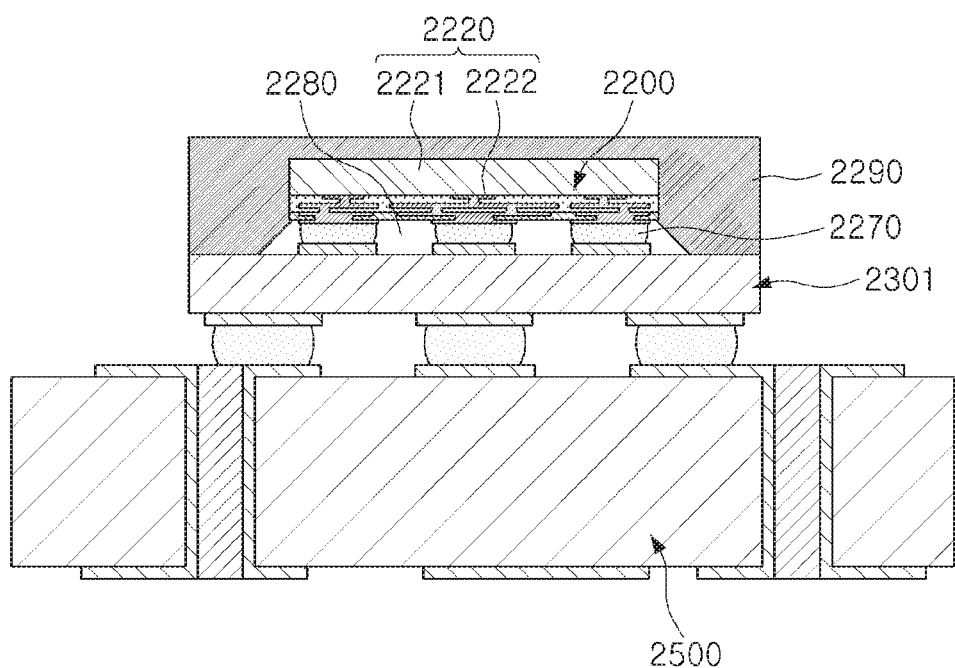
FIG. 5 is a schematic cross-sectional view illustrating a fan-in semiconductor package mounted on an interposer substrate and ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
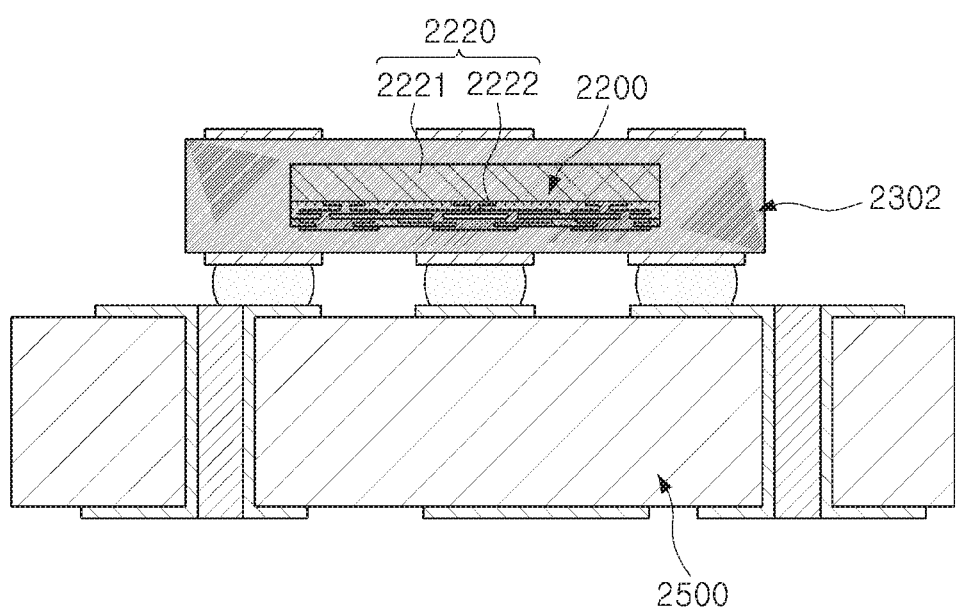
FIG. 6 is a schematic cross-sectional view illustrating a fan-in semiconductor package embedded in an interposer substrate and ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
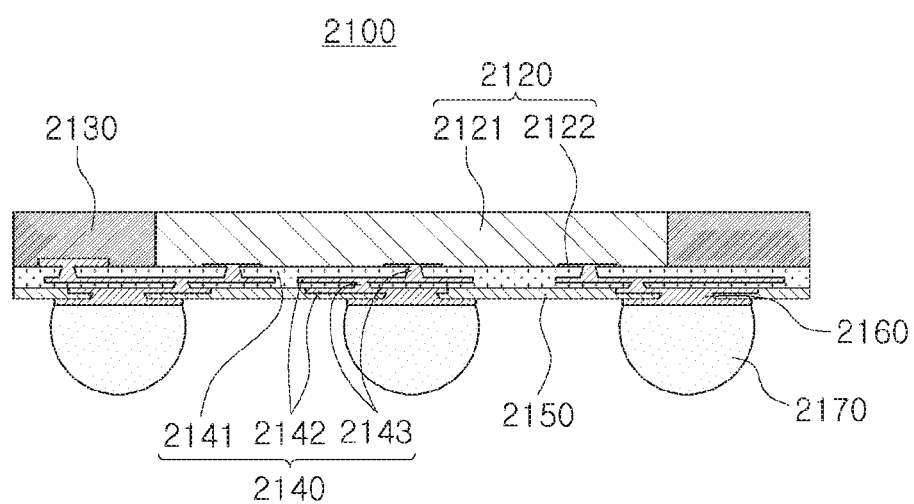
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2202 may further be formed on the connection structure 2140, and an underbump metal layer 2160 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection structure 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
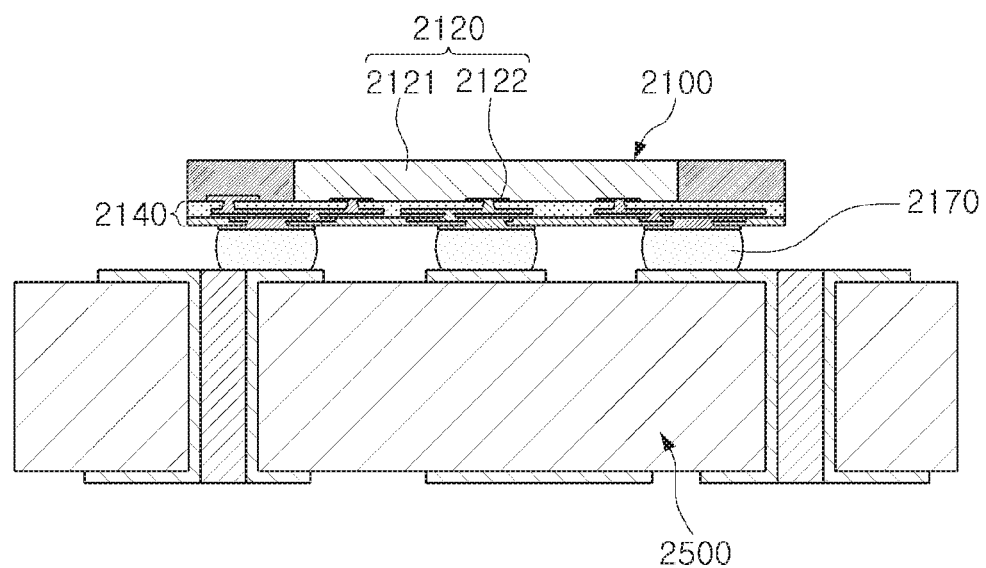
FIG. 8 is a schematic cross-sectional view illustrating a fan-out semiconductor package mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, a semiconductor package, in which adhesion between a metal layer and an encapsulant is improved in an upper portion of a semiconductor chip, and which can be manufactured by a simplified process, will be described with reference to the drawings.

Figure 9:
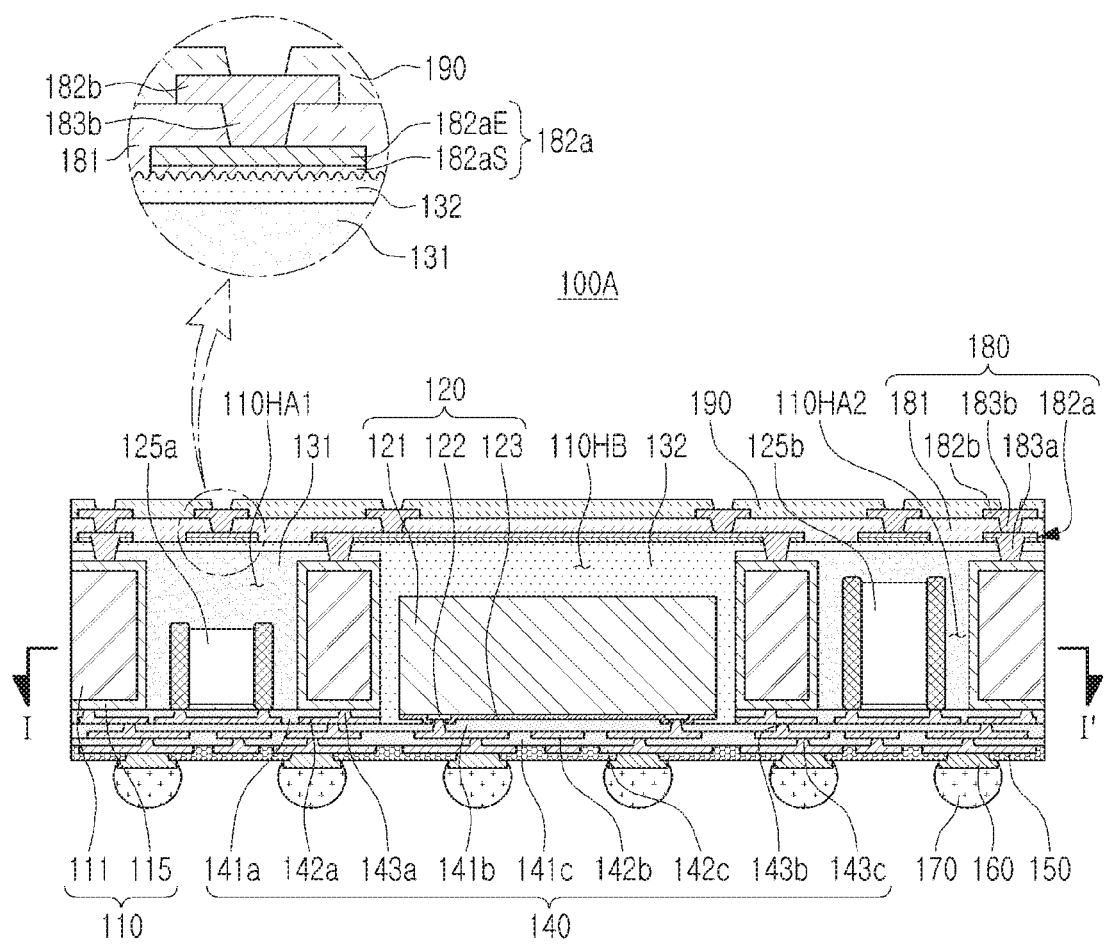
FIG. 9 is a schematic cross-sectional view illustrating an example of a semiconductor package.

FIG. 9 is a schematic cross-sectional view illustrating an example of a semiconductor package.

Figure 10:
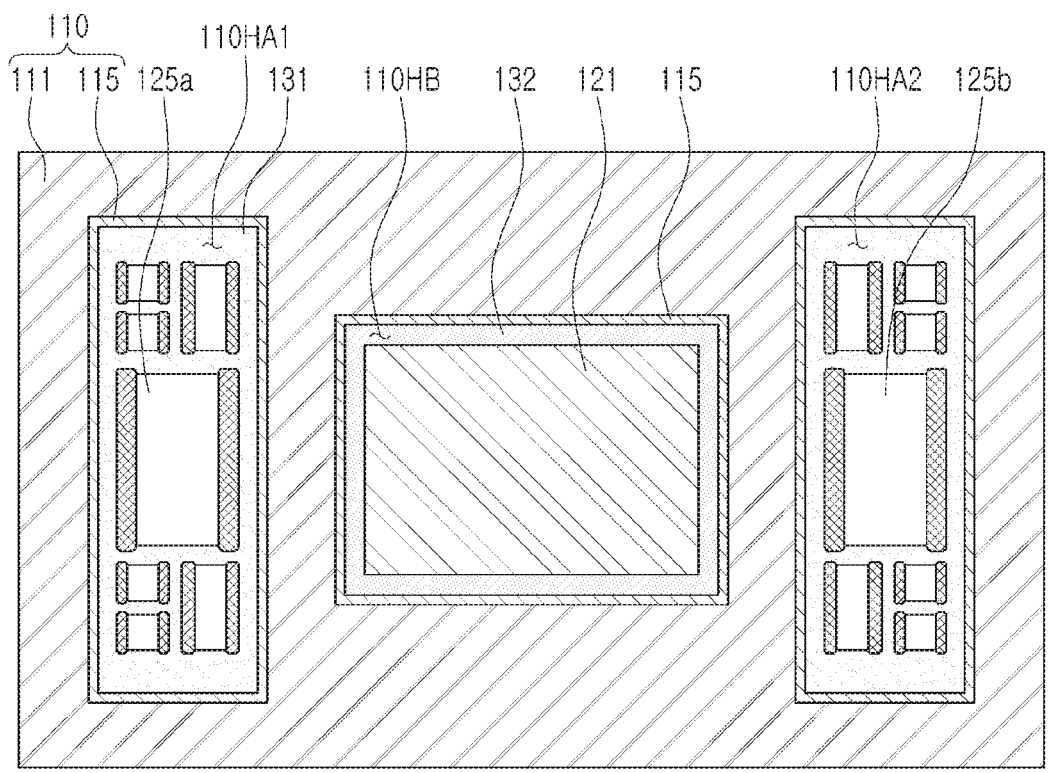
FIG. 10 is a schematic plan view taken along line I-I' of the semiconductor package of FIG. 9.

FIG. 10 is a schematic plan view taken along line I-I' of the semiconductor package of FIG. 9.

Referring to FIGS. 9 and 10, a semiconductor package 100A according to an embodiment may include a frame 110 having first through-holes 110HA1 and 110HA2 and a second through-hole 110HB, at least one passive component 125a and at least one passive component 125b disposed in the first through-holes 110HA1 and 110HA2 of the frame 110, a semiconductor chip 120 disposed in the second through-hole 110HB of the frame 110 and having an active surface on which the connection pad 122 is disposed and an inactive surface opposing the active surface, a first encapsulant 131 sealing at least portions of the frame 110 and the passive components 125a and 125b, a second encapsulant 132 sealing at least portions of the frame 110 and the semiconductor chip 120, a connection structure 140 disposed on the frame 110, lower surfaces of the passive components 125a and 125b, and the active surface of the semiconductor chip 120, a backside connection structure 180 disposed on the second encapsulant 132 and including at least one metal layer 182a and 182b, a first passivation layer 150 disposed on the connection structure 140, an underbump metal layer 160 disposed in an opening of the first passivation layer 150, an electrical connection metal 170 disposed on the first passivation layer 150 and connected to the underbump metal layer 160, and a second passivation layer 190 disposed on the backside connection structure 180.

The backside connection structure 180 may include a first metal layer 182a disposed on the second encapsulant 132, a first backside via 183a passing through the first and second encapsulants 131 and 132 and connecting the frame 110 to the first metal layer 182a, a backside insulating layer 181 disposed on the first metal layer 182a, a second metal layer 182b disposed on the backside insulating layer 181, and a second backside via 183b connecting the first metal layer 182a to the second metal layer 182b. At least a portion of the first metal layer 182a may be disposed to overlap the semiconductor chip 120 in an upper portion of the semiconductor chip 120.

In detail, the first metal layer 182a, disposed to be in contact with an upper surface of the second encapsulant 132, includes a first conductive layer 182aS and a second conductive layer 182aE, vertically stacked. A lower surface of the first conductive layer 182aS is in direct contact with an upper surface of the second encapsulant 132, and has roughness along an upper surface of the second encapsulant 132, that is, surface roughness. The upper surface of the second encapsulant 132 may have roughness formed intentionally for improving a bonding force or formed according to characteristics of a material of the second encapsulant 132. Thus, a lower surface of the first conductive layer 182aS may have first surface roughness. An upper surface of the first conductive layer 182aS is in direct contact with the second conductive layer 182aE, and may have second surface roughness, smaller than the first surface roughness. The second surface roughness may have a small value, close to zero. For example, the second surface roughness may be equal to or less than about 2 μm, particularly, about 0.5 μm, but is not limited thereto. Thus, the upper surface of the first conductive layer 182aS may be a flat and smooth surface when viewed with naked eyes. The first surface roughness may vary according to embodiments and may be in a range, for example, from a few micrometers to several millimeters. An upper surface of the second encapsulant 132 may have surface roughness equal to or similar to the first surface roughness. Since the second conductive layer 182aE generally has morphology according to morphology of a surface on which the second conductive layer is formed, a lower surface and an upper surface of the second conductive layer 182aE may have surface roughness, equal to or similar to the second surface roughness.

The first conductive layer 182aS may be, for example, a copper foil layer including a copper (Cu) foil, and the second conductive layer 182aE may be an electroplated layer formed using the first conductive layer 182aS as a seed layer. A thickness of the second conductive layer 182aE may be greater than a thickness of the first conductive layer 182aS, but is not limited thereto. For example, the second conductive layer 182aE may be a layer including copper (Cu), in a manner similar to the first conductive layer 182aS, but is not limited thereto. The second conductive layer may include a conductive material such as aluminum (Al), silver (Ag), tin (Sn), gold (Au), nickel (Ni), lead (Pb), titanium (Ti), or alloys thereof. The first conductive layer 182aS may be a copper foil, forming a portion of a carrier, during a manufacturing process of the semiconductor package 100A. As the first conductive layer 182aS, the copper foil, is disposed on the second encapsulant 132, adhesion may be improved, as compared with the case in which chemical copper is disposed on the second encapsulant 132 by electroless plating. Moreover, since a portion of the carrier, used during a manufacturing process, is used as a seed layer for plating, a manufacturing process may be simplified.

The respective components included in the semiconductor package 100A according to an embodiment will hereinafter be described in more detail.

The frame 110 may improve rigidity of the semiconductor package 100A depending on certain materials, and serve to secure uniformity of thicknesses of the first and second encapsulants 131 and 132. The frame 110 has a plurality of first and second through-holes 110HA1 and 110HA2, and 110HB. The first and second through-holes 110HA1 and 110HA2, and 110HB may be disposed to be physically spaced apart from each other. The first through-holes 110HA1 and 110HA2 may pass through the frame 110, while the passive components 125a and 125b may be disposed in the first through-holes 110HA1 and 110HA2. As illustrated in FIG. 9, the passive components 125a and 125b may be disposed to be spaced apart from wall surfaces of the first through-holes 110HA1 and 110HA2 by a predetermined distance, and may be surrounded by the wall surfaces of the first through-holes 110HA1 and 110HA2, but are not limited thereto. The second through-hole 110HB may pass through the frame 110 and the first encapsulant 131, while the semiconductor chip 120 may be disposed in the second through-hole 110HB. The semiconductor chip 120 may be disposed to be spaced apart from a wall surface of the second through-hole 110HB by a predetermined distance, and may be surrounded by the wall surface of the second through-hole 110HB. However, such a form is only an example and may be variously modified to have other forms, and another function may be performed depending on such a form. The frame 110 may optionally be omitted, but the case having the frame 110 may be more advantageous in securing the board level reliability as intended in the present disclosure.

The frame 110 may include a frame insulating layer 111 and a frame metal layer 115 surrounding the frame insulating layer 111. An insulating material may be used as the material of the frame insulating layer 111. In this case, the insulating material may be a thermosetting resin such as an epoxy resin, a thermoplastic resin such as a polyimide resin, an insulating material in which the thermosetting resin or the thermoplastic resin is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Such a frame 110 may serve as a supporting member.

The frame metal layer 115 may be disposed in an inner side wall of each of the first through-holes 110HA1 and 110HA2 and the second through-hole 110HB. As illustrated in FIG. 10, the frame metal layer 115 may be disposed to surround each of the passive components 125a and 125b, and the semiconductor chip 120. The frame metal layer 115 may be introduced to improve an electromagnetic interference (EMI) shielding effect and a heat dissipation effect of the passive components 125a and 125b and the semiconductor chip 120. The frame metal layer 115 may include a conductive material such as copper (Cu), aluminum (Al), silver (Ag), tin (Sn), gold (Au), nickel (Ni), lead (Pb), titanium (Ti), or alloys thereof. The frame metal layer 115 may be formed using a plating process, and may be formed of a seed layer and a conductor layer. The frame metal layer 115 may be used as a ground. In this case, the frame metal layer may be electrically connected to a ground pattern layer in the connection structure 140.

The semiconductor chip 120 may be an integrated circuit (IC) providing in an amount of several hundred to several million or more elements integrated in a single chip. The IC may be, for example, a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, an application processor (AP). However, the present disclosure is not limited thereto, and the semiconductor chip may be a logic chip such as an analog-to-digital converter (ADC), an application-specific integrated circuit (ASIC), or the like, or a memory chip such as a volatile memory (for example, a dynamic random access memory (DRAM)), a non-volatile memory (for example, a read only memory (ROM)), a flash memory, or the like, but is not limited thereto Moreover, these chip related components are also combined.

In the semiconductor chip 120, a side, on which connection pad 122 is disposed, is referred to as an active surface, and the opposite side is referred to as an inactive surface. The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide layer, a nitride layer, or the like, or a double layer of an oxide layer and a nitride layer.

Each of the passive components 125a and 125b may be a capacitor such as a multilayer ceramic capacitor (MLCC) or a low inductance chip capacitor (LICC), an inductor such as a power inductor, a bead, or the like, independently. The passive components 125a and 125b may have different sizes and thicknesses. Moreover, each of the passive components 125a and 125b may have a thickness different from a thickness of the semiconductor chip 120. In the semiconductor package 100A according to an embodiment, the passive components 125a and 125b and the semiconductor chip 120 are sealed in different processes, so a problem of defects due to such thickness variations may be significantly reduced. The number of the passive components 125a and 125b are not particularly limited, and may be more or less than that illustrated in the drawings.

The first encapsulant 131 fills at least portions of the first through-holes 110HA1 and 110HA2, and may seal one or more passive components 125a and 125b. An encapsulation form of the first encapsulant 131 is not particularly limited, but may be a form in which the first encapsulant 131 surrounds at least portions of the passive components 125a and 125b. The first encapsulant 131 may cover at least portions of an upper surface and a lower surface of the passive components 125a and 125b, and may fill at least a portion of a space between wall surfaces of the first through-holes 110HA1 and 110HA2 and side surfaces of a plurality of passive components 125a and 125b. The first encapsulant 131 is extended to the frame 110 to be disposed on the frame 110, and may be in contact with an upper surface of the frame metal layer 115.

The second encapsulant 132 may fill at least a portion of the second through-hole 110HB, while sealing the semiconductor chip 120. An encapsulation form of the second encapsulant 132 is not particularly limited, but may be a form in which the second encapsulant 132 surrounds at least a portion of the semiconductor chip 120. In this case, the second encapsulant 132 may cover at least portions of the frame 110 and an inactive surface of the semiconductor chip 120, and fill at least a portion of a space between a wall surface of the second through-hole 110HB and a side surface of the semiconductor chip 120. Meanwhile, the second encapsulant 132 may fill the second through-hole 110HB to thus serve as an adhesive for fixing the semiconductor chip 120 and reduce buckling at the same time, depending on certain materials. The second encapsulant 132 is disposed in an upper portion of the semiconductor chip 120 as described above, is extended to upper portions of the passive components 125a and 125b and the frame 110, and may be disposed on the first encapsulant 131, on the passive components 125a and 125b and the frame 110. Thus, the first and second encapsulants 131 and 132 are stacked sequentially and arranged on the passive components 125a and 125b and the frame 110, and the second encapsulant 132 may be only disposed on the semiconductor chip 120.

The first and second encapsulants 131 and 132 may include an insulating material. The insulating material may be a material containing an inorganic filler and an insulating resin, for example, a thermosetting resin such as an epoxy resin, a thermoplastic resin such as a polyimid, or a resin in which a reinforcement such as an inorganic filler is contained in the thermosetting resin or the thermoplastic resin, in detail, an Ajinomoto build-up film (ABF), an FR-4 resin, a bismaleimide triazine (BT) resin, a resin, or the like. Moreover, an epoxy molding compound (EMC), a photo imageable encapsulant (PIE), or the like, may be used therefor. As needed, a material in which an insulating resin such as the thermosetting resin or the thermoplastic resin is impregnated in an inorganic filler together with a core material such as a glass fiber, may be used. The first and second encapsulants 131 and 132 may include the same or different materials as each other.

The connection structure 140 may redistribute the connection pads 122 of the semiconductor chip 120. Several tens to several hundreds of connection pads 122 of the semiconductor chip 120 having various functions may be redistributed by the connection structure 140, and may be physically or electrically externally connected through the electrical connection metal 170 depending on functions. The connection structure 140 may include a number of insulating layers, redistribution layers, and vias, greater than the number illustrated in the drawings.

The connection structure 140 may include a first insulating layer 141a disposed on the frame 110 and the passive components 125a and 125b, a first redistribution layer 142a disposed on the first insulating layer 141a, and a first via 143a connecting the first redistribution layer 142a, the passive components 125a and 125b, and the frame metal layer 115. The connection structure 140 may further include the second insulating layer 141b disposed on the first insulating layer 141a, the second redistribution layer 142b disposed on the second insulating layer 141b, and the second via 143b connecting the first and second redistribution layers 142a and 142b or connecting the connection pad 122 of the semiconductor chip 120 and the second redistribution layer 142b while passing through the second insulating layer 141b. The connection structure 140 may also include a third insulating layer 141c disposed on the second insulating layer 141b, a third redistribution layer 142c disposed on the third insulating layer 141c, and a third via 143c connecting the second and third redistribution layers 142b and 142c while passing through the third insulating layer 141c. The first redistribution layer 142a is electrically connected to the passive components 125a and 125b, and the second and third redistribution layers 142b and 142c are electrically connected to the connection pad 122 of the semiconductor chip 120 and the passive components 125a and 125b. The connection structure 140 may include a number of insulating layers, redistribution layers, and vias, greater or smaller than the number illustrated in the drawings.

A material of each of the insulating layers 141a, 141b, and 141c may be an insulating material. In this case, a photosensitive insulating material such as a PID resin may also be used as the insulating material. That is, each of the insulating layers 141a, 141b, and 141c may be a photosensitive insulating layer. When the insulating layers 141a, 141b, and 141c have photosensitive properties, the insulating layers 141a, 141b, and 141c may be formed to have a smaller thickness, and a fine pitch of each of the vias 143a, 143b, and 143c may be achieved more easily. Each of the insulating layers 141a, 141b, and 141c may be a photosensitive insulating layer including an insulating resin and an inorganic filler. When the insulating layers 141a, 141b, and 141c are multiple layers, materials of the insulating layers 141a, 141b, and 141c may be the same as each other, and may alternately be different from each other. When the insulating layers 141a, 141b, and 141c are multiple layers, the insulating layers 141a, 141b, and 141c may be integrated with each other depending on processes, so that a boundary therebetween may not be readily apparent. The number of insulating layers, greater than those illustrated in the drawings, may be provided.

The second and third redistribution layers 142b and 142c, among the redistribution layers 142a, 142b, and 142c, may substantially serve to redistribute the connection pads 122, and a formation material thereof may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of corresponding layers. For example, the redistribution layers may include ground (GND) patterns, and may include power (PWR) patterns, signal (S) patterns, and the like. Here, the signal (S) patterns may include various signals except for the ground (GND) signals, the power (PWR) signals, and the like, such as data signals, and the like. Moreover, the redistribution layers 142a, 142b, and 142c may include via pad patterns, electrical connection metal pad patterns, and the like.

The vias 143a, 143b, and 143c may electrically connect the redistribution layers 142a, 142b, and 142c, the connection pads 122, the passive components 125a and 125b, and the like, formed on different layers, to each other, resulting in an electrical path in the semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with a conductive material, or the conductive material may be formed along a wall of a via. In addition, the vias 143a, 143b, and 143c may have various shapes, such as a tapered shape, a cylindrical shape, and the like.

A backside connection structure 180 may be disposed on the second encapsulant 132 to cover the semiconductor chip 120 and the passive components 125a and 125b. The backside connection structure 180 may be electrically connected to the connection pad 122 of the semiconductor chip 120 and/or the connection structure 140. Moreover, the backside connection structure 180 may electrically connect a semiconductor chip or a semiconductor package, mounted on an upper portion of a package, to the connection structure 140 in a lower portion of the package. In the backside connection structure 180, the first metal layer 182a may be connected to the frame metal layer 115 of the frame 110 through the first backside via 183a, passing through the first and second encapsulants 131 and 132. The first backside via 183a may have a form of passing through the first conductive layer 182aS of the first metal layer 182a to be connected to the second conductive layer 182aE. At least a portion of the second metal layer 182b may be exposed upwardly through the second passivation layer 190 for connection with a configuration in an upper portion. By the first and second metal layers 182a and 182b, as well as the first and second backside vias 183a and 183b, the semiconductor chip 120 and the passive components 125a and 125b are surrounded, so an EMI shielding effect and a heat dissipation effect of the package may be further improved. The first and second metal layers 182a and 182b, and the first and second backside vias 183a and 183b may include a conductive material such as copper (Cu), aluminum (Al), silver (Ag), tin (Sn), gold (Au), nickel (Ni), lead (Pb), titanium (Ti), or alloys thereof. A material of the backside insulating layer 181 may be an insulating material. In this case, the insulating material may be the insulating material described above or a photosensitive insulating material such as a PID resin, in a manner similar to the insulating layers 141a, 141b, and 141c of the connection structure 140.

The first passivation layer 150 may protect the connection structure 140 from external physical or chemical damage. The first passivation layer 150 may have one or more opening(s) exposing at least a portion of the third redistribution layer 142c of the connection structure 140. The number of openings, formed in the first passivation layer 150, may be several tens to several thousands. A material of the first passivation layer 150 is not particularly limited. For example, an insulating material may be used as the material of the first passivation layer. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used therefor. A second passivation layer 190 is also formed on the backside connection structure 180 to protect the backside connection structure 180. The first passivation layer 150 and the second passivation layer 190 include the same material, thereby serving to control a coefficient of thermal expansion (CTE) due to an effect of symmetry.

The underbump metal layer 160 may improve connection reliability of the electrical connection metal 170 to improve board level reliability of the semiconductor package 100A. The underbump metal layer 160 may be connected to the third redistribution layer 142c of the connection structure 140, exposed through the openings of the first passivation layer 150. The underbump metal layer 160 may be formed in the openings of the first passivation layer 150 by any appropriate metallization method using any appropriate conductive material such as a metal, but is not limited thereto.

The electrical connection metal 170 physically and/or electrically connects the semiconductor package 100A to an external power source. For example, the semiconductor package 100A may be mounted on the mainboard of the electronic device through the electrical connection metal 170. The electrical connection metal 170 may be formed of a conductive material, for example, a solder or the like. However, this is only an example, and a material of each of the electrical connection metal 170 is not particularly limited thereto. Each of the electrical connection metals 170 may be a land, a ball, a pin, or the like. The electrical connection metals 170 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder or copper. However, the electrical connection metal is only an example, and the present disclosure is not limited thereto. The number, an interval, a disposition form, and the like, of the electrical connection metals 170 are not particularly limited, but may be sufficiently modified depending on design particulars. For example, the electrical connection metals 170 may be provided in an amount of several tens to several thousands, or may be provided in an amount of several tens to several thousands or more or several tens to several thousands or less.

At least one of the electrical connection metals 170 may be disposed in a fan-out region of the semiconductor chip 120. The fan-out region refers to a region except for (or outside of) a region in which the semiconductor chip 120 is disposed. The fan-out package may have excellent reliability as compared to a fan-in package, may allow a plurality of input/output (I/O) terminals to be implemented, and may facilitate a 3D interconnection. In addition, as compared to a ball grid array (BGA) package, a land grid array (LGA) package, or the like, the fan-out package may be manufactured to have a small thickness, and may have price competitiveness.

FIGS. 11A to 11E are schematic process drawings illustrating a manufacturing example of the semiconductor package of FIG. 9.

Figure 11A:
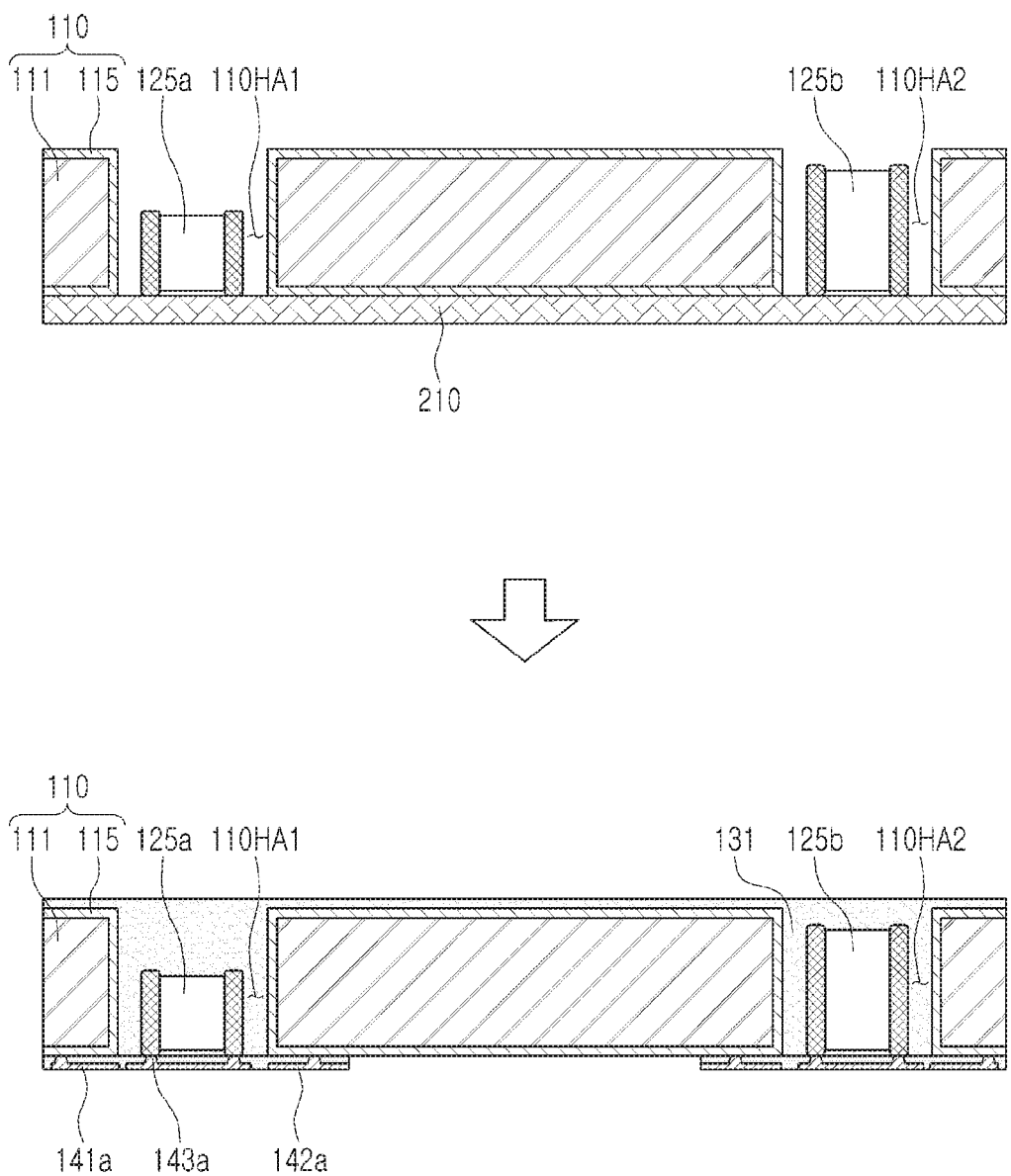
FIGS. 11A to 11E are schematic process drawings illustrating manufacturing steps of an example manufacturing process of the semiconductor package of FIG. 9.

Referring to FIG. 11A, a frame 110 is prepared, first through-holes 110HA1 and 110HA2, passing through an upper surface and a lower surface of the frame 110, are formed, a frame metal layer 115 is formed on an inner side wall and an upper surface and a lower surface of the first through-holes 110HA1 and 110HA2, a first adhesive film 210 is attached to one side of the frame 110, and passive components 125a and 125b are disposed on the first adhesive film 210 in the first through-holes 110HA1 and 110HA2. Then, the first encapsulant 131 is used to seal the passive components 125a and 125b and, optionally, an upper surface of the frame 110. The first adhesive film 210 is removed, and the first insulating layer 141a, the first redistribution layer 142a, and the first via 143a, which are a portion of the connection structure 140, may be formed in a lower portion of the passive components 125a and 125b and on lower surfaces of the frame 110 and first encapsulant 131. The first encapsulant 131 may seal at least upper surfaces of the frame 110 and the passive components 125a and 125b, while filling a space in the first through-holes 110HA1 and 110HA2.

Figure 11B:
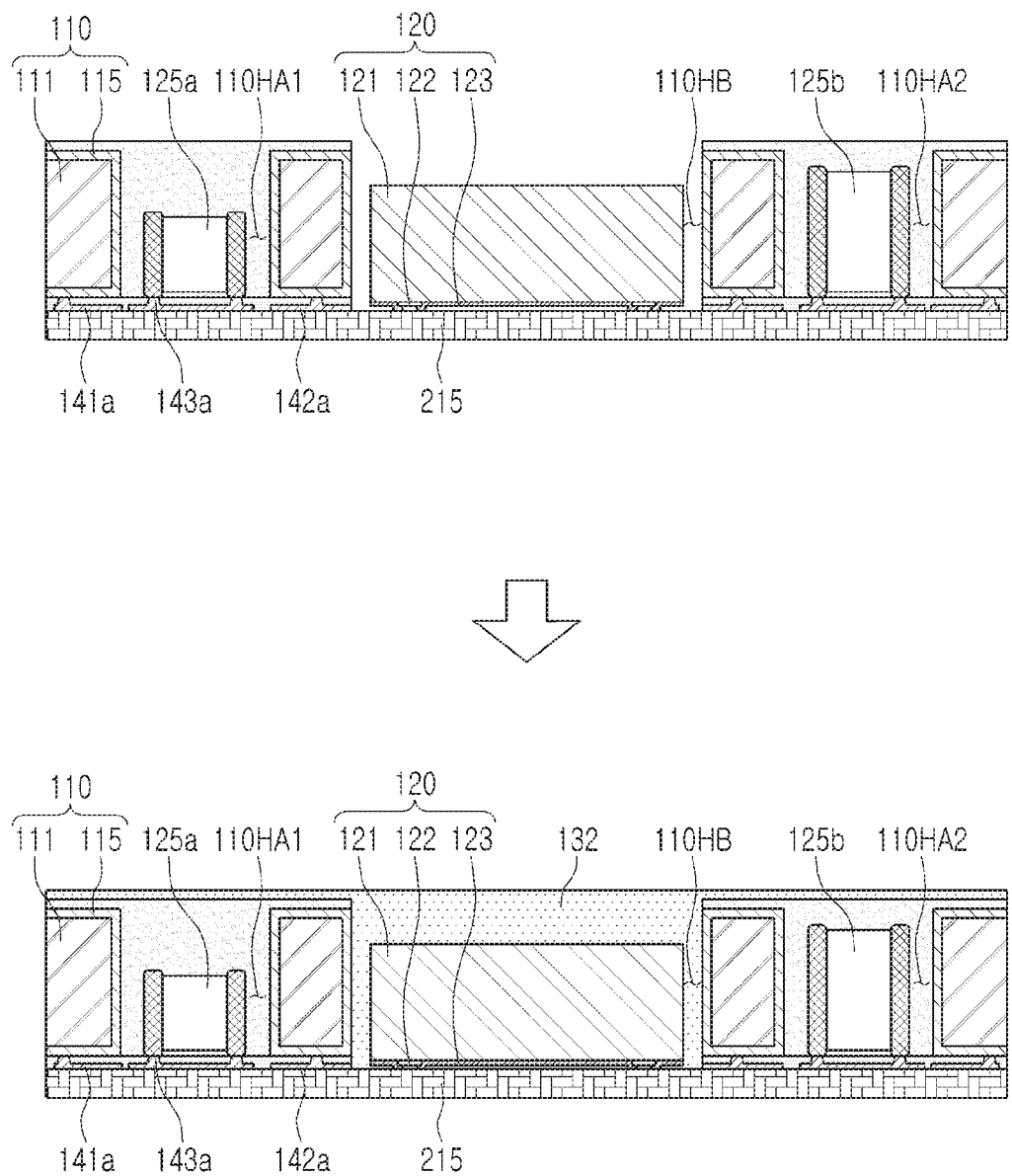

Referring to FIG. 11B, a second adhesive film 215 is attached to one side of the frame 110 (e.g., attached to a lower surface of the first redistribution layer 142a), a second through-hole 110HB, passing through an upper surface and a lower surface of the frame 110, is formed (and, optionally, the frame metal layer 115 is formed on an inner side wall of the second through-hole 110HB), and a semiconductor chip 120 is disposed on the second adhesive film 215 in the second through-hole 110HB. Then, the second encapsulant 132 is used to seal the semiconductor chip 120 in the second through-hole 110HB.

Figure 11C:
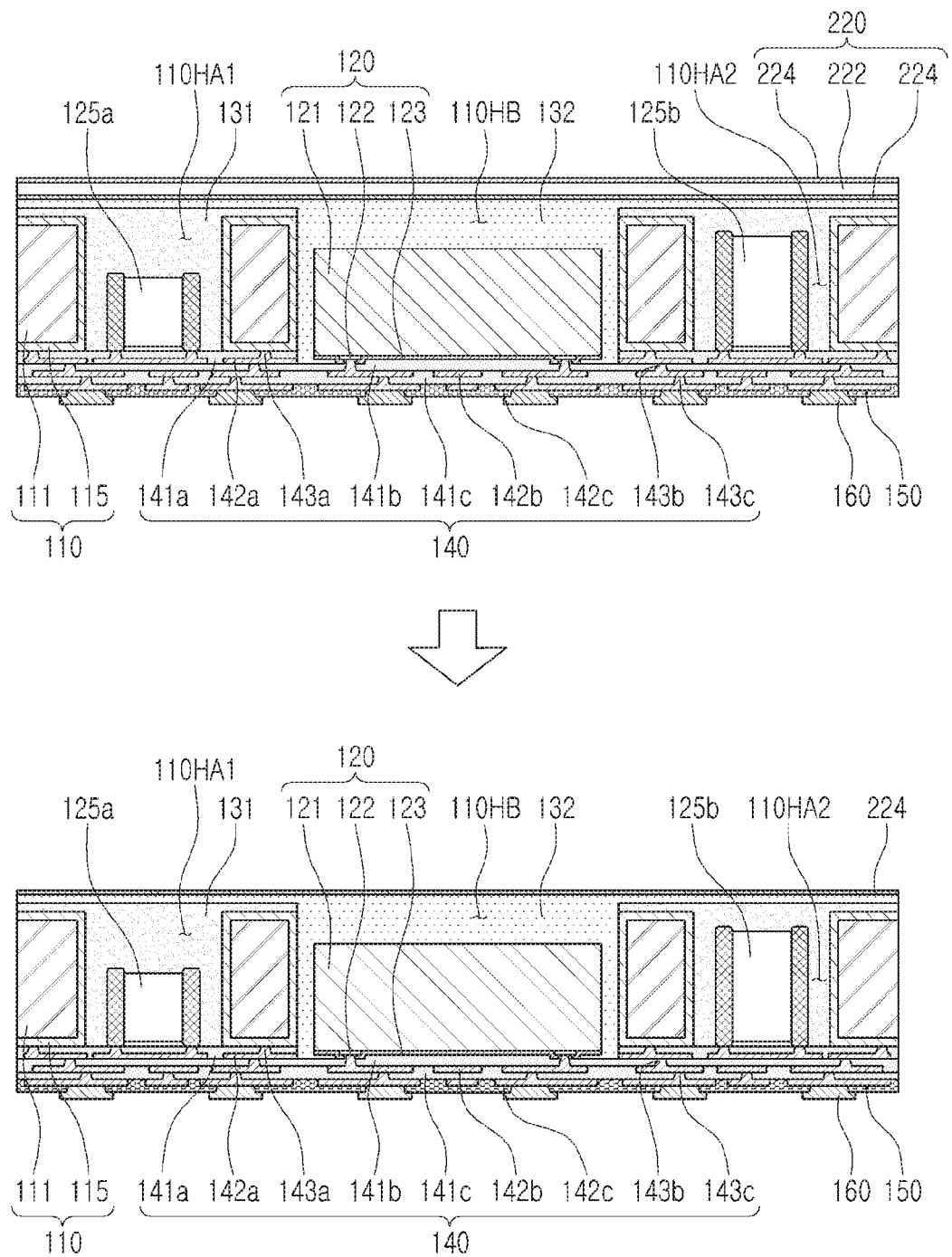

Referring to FIG. 11C, first, a carrier 220, including a core layer 222 and upper and lower first conductive layers 224, disposed on both sides of the core layer 222, is prepared, the carrier 220 is attached to the second encapsulant 132, the second adhesive film 215 is removed from a lower surface, and second and third insulating layers 141b and 141c, second and third redistribution layers 142b and 142c, and second and third vias 143b and 143c are formed to form a connection structure 140. Moreover, a first passivation layer 150, covering the connection structure 140, is formed, an opening exposing at least a portion of the third redistribution layer 142c is formed in the first passivation layer 150, and an underbump metal layer 160 is formed in the opening. The carrier 220 may be, for example, a double cladding fiber (DCF), and may control warpage, during formation of the connection structure 140. According to embodiments, before the carrier 220 is attached, a surface treatment process is performed on an upper surface of the second encapsulant 132 to increase surface roughness. Next, the core layer 222 and the upper first conductive layer 224 are detached, so that only the lower first conductive layer 224 remains of the carrier 220. Accordingly, only the lower first conductive layer 224 remains in the upper surface of the second encapsulant 132.

Figure 11D:
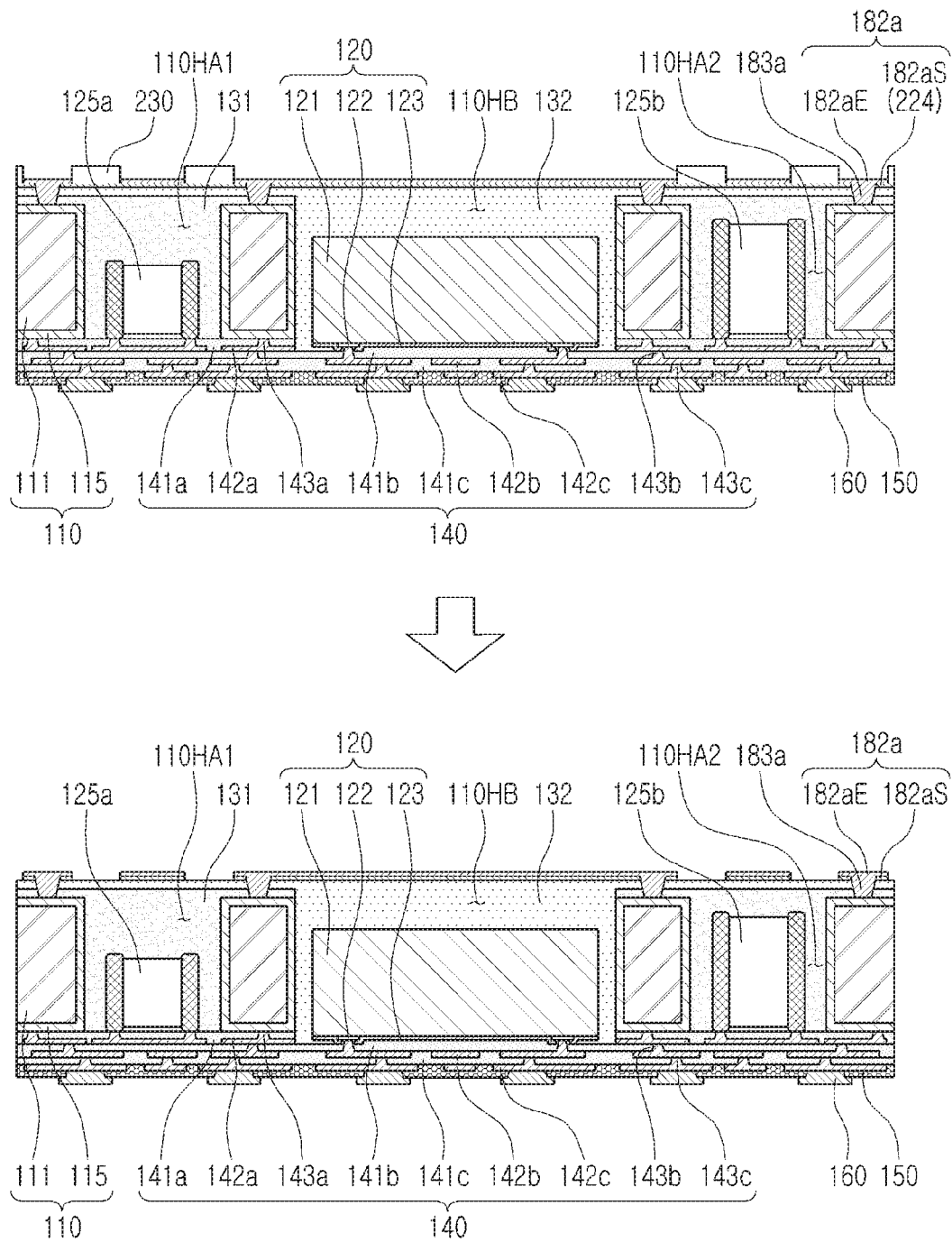

Referring to FIG. 11D, after a via hole passing through the lower first conductive layer 224 is formed, a mask pattern 230 is formed, and the lower first conductive layer 224 is used as a plating seed layer to perform a plating process, so a second conductive layer 182aE and a first backside via 183a are formed. Accordingly, a side surface of the first backside via 183a is extended upwardly to pass through the lower first conductive layer 224, and the first backside via 183a may have a form connected to (or integrated with) the second conductive layer 182aE. Then, the mask pattern 230 and portions of the lower first conductive layer 224 below the mask pattern 230 are removed. Thus, a first metal layer 182a including a second conductive layer 182aE and a first conductive layer 182aS formed of the lower first conductive layer 224 of the carrier 200, may be formed.

Figure 11E:
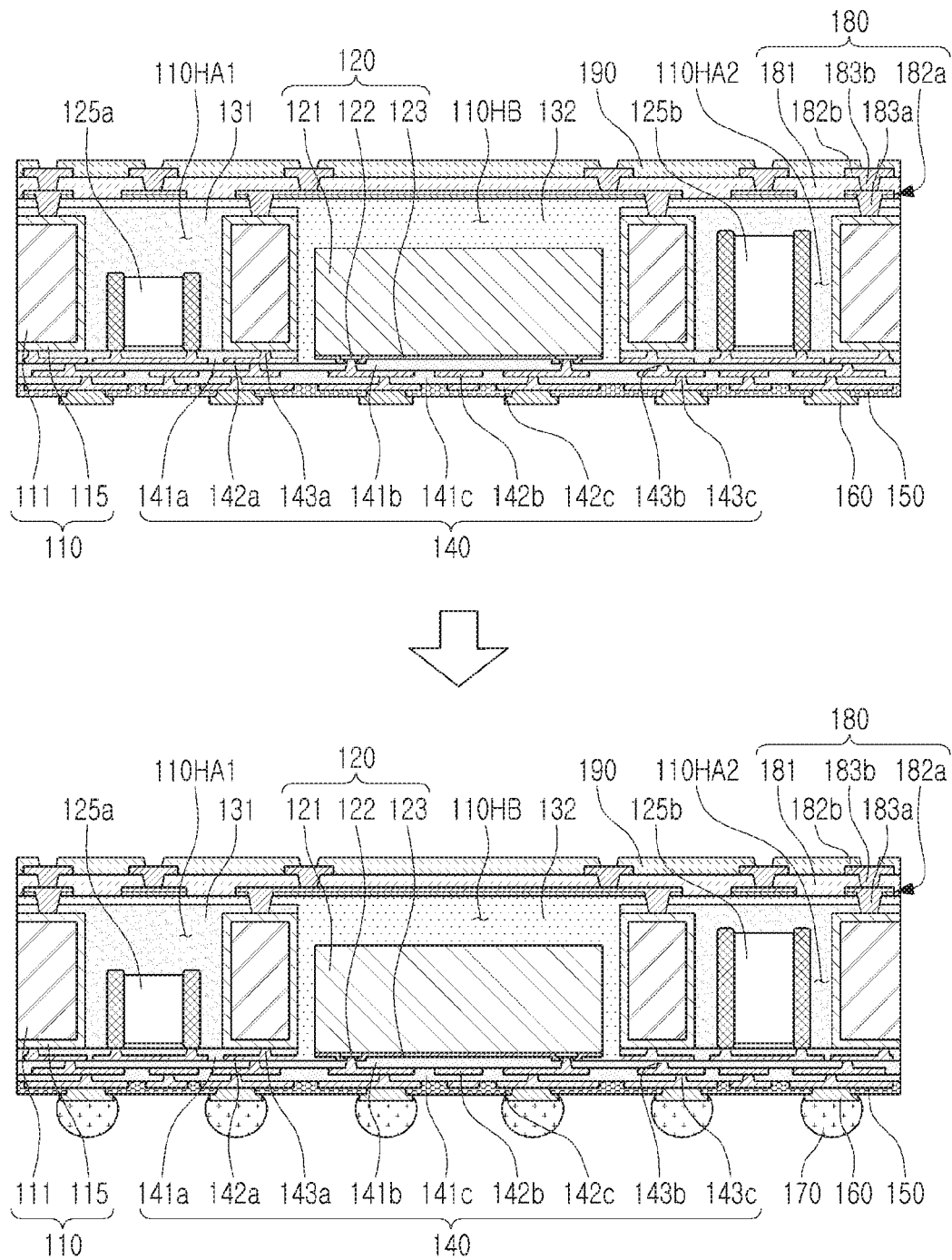

Referring to FIG. 11E, on the first metal layer 182a, a backside insulating layer 181, a second metal layer 182b, and a second backside via 183b are formed to form a backside connection structure 180, and a second passivation layer 190 is formed. According to embodiments, the first passivation layer 150 and the underbump metal layer 160 may be formed in this operation. In this case, the first passivation layer 150 may be formed simultaneously with the second passivation layer 190, or may be formed using a separate process. Then, an electrical connection metal 170 is formed on the underbump metal layer 160. In some cases, only the underbump metal layer 160 may be formed, and thereafter, a customer company may optionally form an electrical connection metal by a separate subsequent process.

Meanwhile, a series of processes may include manufacturing a large-sized frame 110 to facilitate mass production, manufacturing a plurality of packages 100A by the above-mentioned processes, and then performing a process of singulation for individual packages 100A by a sawing process.

Figure 12:
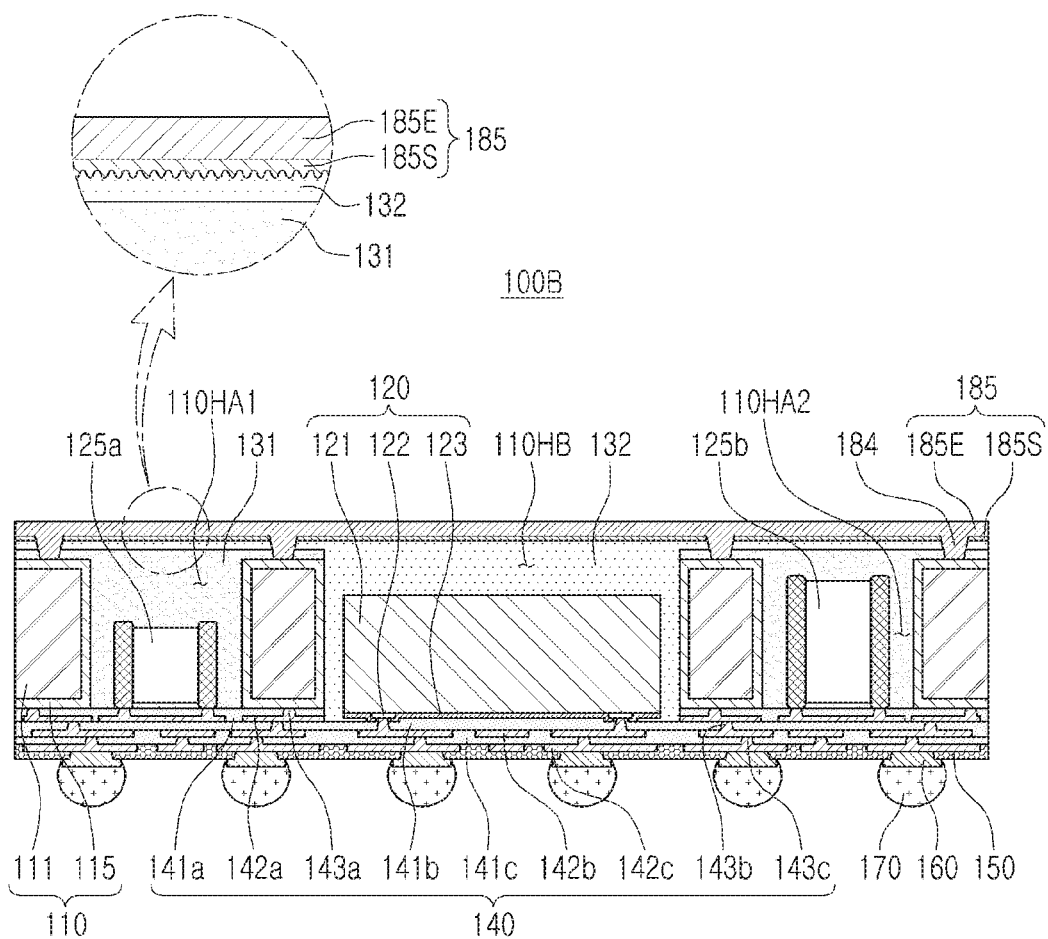
FIG. 12 is a schematic cross-sectional view illustrating another example of a semiconductor package.

FIG. 12 is a schematic cross-sectional view illustrating another example of a semiconductor package.

Referring to FIG. 12, a semiconductor package 100B according to another embodiment may include a frame 110 having first through-holes 110HA1 and 110HA2 and a second through-hole 110HB, at least one passive component 125a and at least one passive component 125b disposed in the first through-holes 110HA1 and 110HA2 of the frame 110, a semiconductor chip 120 disposed in the second through-hole 110HB of the frame 110, and having an active surface on which the connection pad 122 is disposed and an inactive surface opposing the active surface, a first encapsulant 131 sealing at least portions of the frame 110 and the passive components 125a and 125b, a second encapsulant 132 sealing at least portions of the frame 110 and the semiconductor chip 120, a connection structure 140 disposed on the frame 110, lower surfaces of the passive components 125a and 125b, and the active surface of the semiconductor chip 120, a metal layer 185 disposed on the second encapsulant 132 and including a first conductive layer 185S and a second conductive layer 185E, a backside via 184 connecting the metal layer 185 to the frame 110, a passivation layer 150 disposed on the connection structure 140, an underbump metal layer 160 disposed in an opening of the passivation layer 150, and an electrical connection metal 170 disposed on the passivation layer 150 and connected to the underbump metal layer 160.

The metal layer 185 is disposed to cover the semiconductor chip 120 and the passive component 125 on the second encapsulant 132, and may be connected to the frame metal layer 115 of the frame 110 through a backside via 184 passing through the first and second encapsulants 131 and 132. At least a portion of the metal layer 185 may be disposed to overlap the semiconductor chip 120 in an upper portion of the semiconductor chip 120. The backside via 184 may have a form of passing through a portion of the metal layer 185, for example, a first conductive layer 185S, to be connected to the second conductive layer 185E. The backside via 184 and the metal layer 185 are disposed to surround the semiconductor chip 120 and the passive component 125 (e.g., with the frame metal layer 115 they are electrically connected to), thereby further improving an EMI shielding effect and heat dissipation effect of a package. The backside via 184 and the metal layer 185 may include a conductive material such as copper (Cu), aluminum (Al), silver (Ag), tin (Sn), gold (Au), nickel (Ni), lead (Pb), titanium (Ti), or alloys thereof. The backside via 184 and the metal layer 185 may be used as a ground line. In this case, the backside via 184 and the metal layer 185 may be electrically connected to a ground among the redistribution layers 142a, 142b, and 143c of the connection structure 140 via the frame metal layer 115. The metal layer 185 may have a plate form covering most of an upper surface of the second encapsulant 132. The backside via 184 may have a form of a trench via or a line via having a predetermined length. In this case, substantially all of movement paths of the electromagnetic waves are blocked, and thus the effect of shielding electromagnetic waves may be further excellent. However, it is not limited thereto. Here, in a range in which an effect of shielding electromagnetic waves is provided, the metal layer 185 may have a form including a plurality of plates, and openings may be formed in the regions between the backside vias 184 to provide a gas movement path.

The metal layer 185 is disposed to be in contact with an upper surface of the second encapsulant 132, and may include a first conductive layer 185S and a second conductive layer 185E, vertically stacked, in a manner similar to the first metal layer 182a in the package 100A of an embodiment of FIG. 9. A lower surface of the first conductive layer 185S is in direct contact with an upper surface of the second encapsulant 132, and may have roughness along an upper surface of the second encapsulant 132, that is, surface roughness. The upper surface of the second encapsulant 132 may have roughness formed intentionally for improving roughness or a bonding force according to characteristics of a material of the second encapsulant 132. Thus, a lower surface of the first conductive layer 185S may have first surface roughness. An upper surface of the first conductive layer 185S is in direct contact with the second conductive layer 185E, and may have second surface roughness, smaller than the first surface roughness. The second surface roughness may have a small value, close to zero.

The first conductive layer 185S may be, for example, a copper foil layer including a copper (Cu) foil, and the second conductive layer 185E may be an electroplated layer formed using the first conductive layer 185S as a seed layer. For example, the second conductive layer 185E may be a layer including copper (Cu) in a manner similar to the first conductive layer 185S. A thickness of the second conductive layer 185E may be greater than a thickness of the first conductive layer 185S, but is not limited thereto. The first conductive layer 185S may be a copper foil, forming a portion of a carrier, during a manufacturing process of the semiconductor package 100A. As the first conductive layer 185S, the copper foil, is disposed on the second encapsulant 132, adhesion may be improved, as compared with the case in which chemical copper is disposed on the second encapsulant 132 by electroless plating. Moreover, since a portion of the carrier, used during a manufacturing process, is used as a seed layer for plating, a manufacturing process may be simplified.

Other configurations are substantially the same as those described in the above-described semiconductor package 100A and the like, and a detailed description thereof will be omitted.

Figure 13:
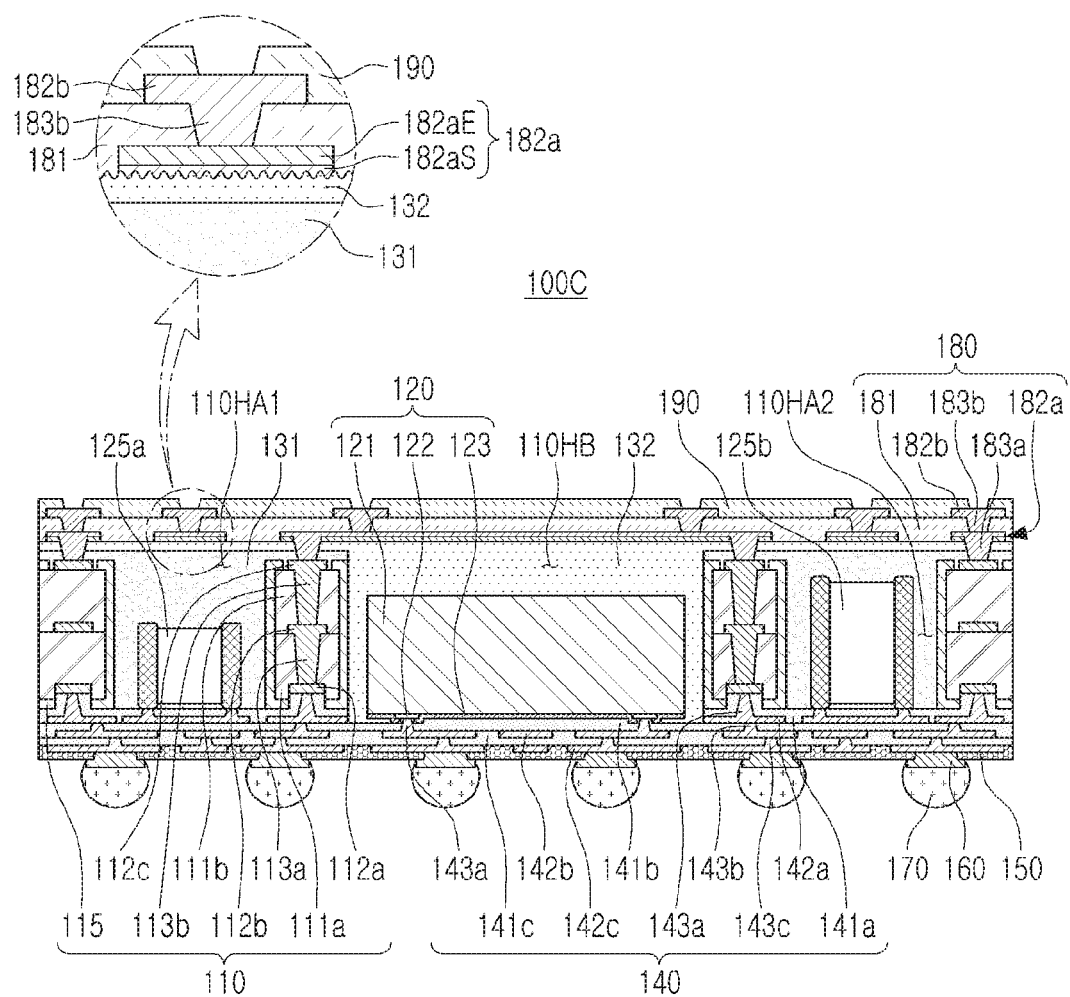
FIG. 13 is a schematic cross-sectional view illustrating another example of a semiconductor package.

FIG. 13 is a schematic cross-sectional view illustrating another example of a semiconductor package.

Referring to FIG. 13, in a semiconductor package 100C according to another example, a frame 110 may include a first frame insulating layer 111a in contact with a connection structure 140, a first wiring layer 112a in contact with the connection structure 140 and embedded in the first frame insulating layer 111a, a second wiring layer 112b disposed on a side opposing the side in which the first wiring layer 112a of the first frame insulating layer 111a is embedded, a second frame insulating layer 111b disposed on the first frame insulating layer 111a and covering the second wiring layer 112b, and a third wiring layer 112c disposed on the second frame insulating layer 111b. The first to third wiring layers 112a, 112b, and 112c are electrically connected to the connection pad 122. The first wiring layer 112a and the second wiring layer 112b, as well as the second wiring layer 112b and the third wiring layer 112c may be electrically connected to each other through the first frame via 113a and the second frame via 113b, passing through the first frame insulating layer 111a and the second frame insulating layer 111b, respectively.

The first wiring layer 112a may be recessed inwardly of the first frame insulating layer 111a. As described above, when the first wiring layer 112a is recessed inwardly of the first frame insulating layer 111a and a step is provided between a lower surface of the first frame insulating layer 111a and a lower surface of the first wiring layer 112a, the first wiring layer 112a may be prevented from being contaminated by bleeding of a formation material of the first encapsulant 130. A thickness of each of the wiring layers 112a, 112b, and 112c of the frame 110 may be greater than that of each of the redistribution layers 142a, 142b, and 142c of the connection structure 140.

When a hole for the first frame via 113a is formed, some pads of the first wiring layer 112a may serve as a stopper. In this regard, it may be advantageous in a process in that the first frame via 113a has a tapered shape in which a width of an upper surface is greater than a width of a lower surface contacting the first wiring layer 112a serving as the stopper. In this case, the first frame via 113a may be integrated with a pad pattern of the second wiring layer 112b. When a hole for the second frame via 113b is formed, some pads of the second wiring layer 112b may serve as a stopper. In this regard, it may be advantageous in a process in that the second frame via 113b has a tapered shape in which a width of an upper surface is greater than a width of a lower surface. In this case, the second frame via 113b may be integrated with a pad pattern of the third wiring layer 112c.

Other configurations are substantially the same as those described in the above-described semiconductor package 100A and the like, and a detailed description thereof will be omitted.

Figure 14:
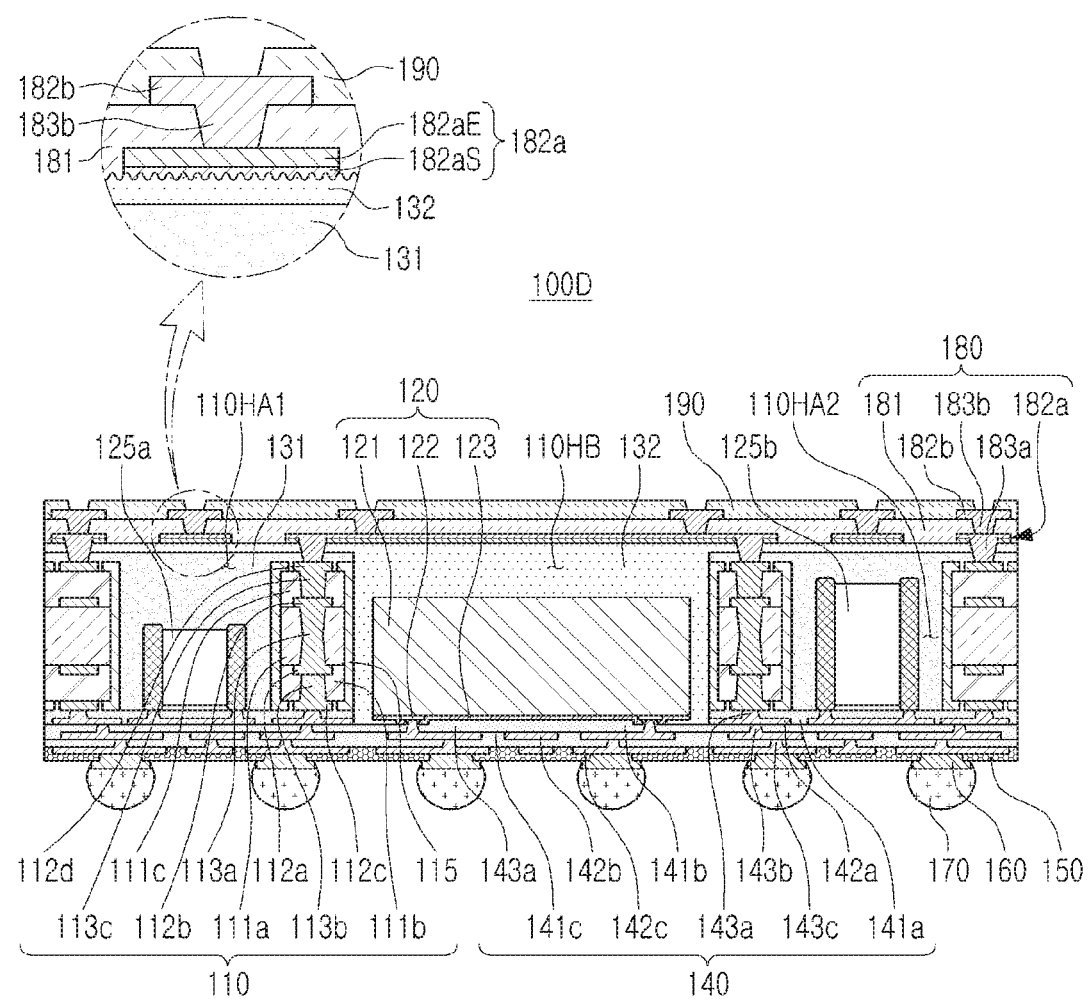
FIG. 14 is a schematic cross-sectional view illustrating another example of a fan-out semiconductor package.

FIG. 14 is a schematic cross-sectional view illustrating another example of a semiconductor package.

Referring to FIG. 14, in a semiconductor package 100D according to another example, a frame 110 may include a first frame insulating layer 111a, a first wiring layer 112a and a second wiring layer 112b disposed on opposite sides/surfaces of the first frame insulating layer 111a, respectively, a second frame insulating layer 111b disposed on the first frame insulating layer 111a and covering the first wiring layer 112a, a third redistribution layer 112c disposed on the second frame insulating layer 111b, a third frame insulating layer 111c disposed on the first frame insulating layer 111a and covering the second wiring layer 112b, and a fourth wiring layer 112d disposed on the third frame insulating layer 111c. The first to fourth wiring layers 112a, 112b, 112c, and 112d may be electrically connected to connection pads 122. Since the frame 110 may include a further large number of wiring layers 112a, 112b, 112c, and 112d, a connection structure 140 may be further simplified. Therefore, a decrease in a yield depending on a defect occurring in a process of forming the connection structure 140 may be suppressed. Meanwhile, the first to fourth wiring layers 112a, 112b, 112c, and 112d may be electrically connected to each other through first to third frame vias 113a, 113b, and 113c passing through the first to third frame insulating layers 111a, 111b, and 111c, respectively.

The first frame insulating layer 111a may have a thickness greater than those of the second frame insulating layer 111b and the third frame insulating layer 111c. The first frame insulating layer 111a may be basically relatively thick in order to maintain rigidity, and the second frame insulating layer 111b and the third frame insulating layer 111c may be introduced in order to form a larger number of wiring layers 112c and 112d. The first frame insulating layer 111a may include an insulating material different from those of the second frame insulating layer 111b and the third frame insulating layer 111c. For example, the first frame insulating layer 111a may be, for example, prepreg including a core material, a filler, and an insulating resin, and the second insulating layer 111b and the third insulating layer 111c may be an ABF film or a PID film including a filler and an insulating resin. However, the materials of the first frame insulating layer 111a and the second and third frame insulating layers 111b and 111c are not limited thereto. Similarly, the first frame via 113a passing through the first frame insulating layer 111a may have a diameter greater than those of the second and third frame vias 113b and 113c passing through the second and third frame insulating layers 111b and 111c, respectively. A thickness of each of the wiring layers 112a, 112b, 112c, and 112d of the frame 110 may be greater than that of each of the redistribution layers 142a, 142b, and 142c of the connection structure 140.

Other configurations are substantially the same as those described in the above-described semiconductor package 100A and the like, and a detailed description thereof will be omitted.

Figure 15:
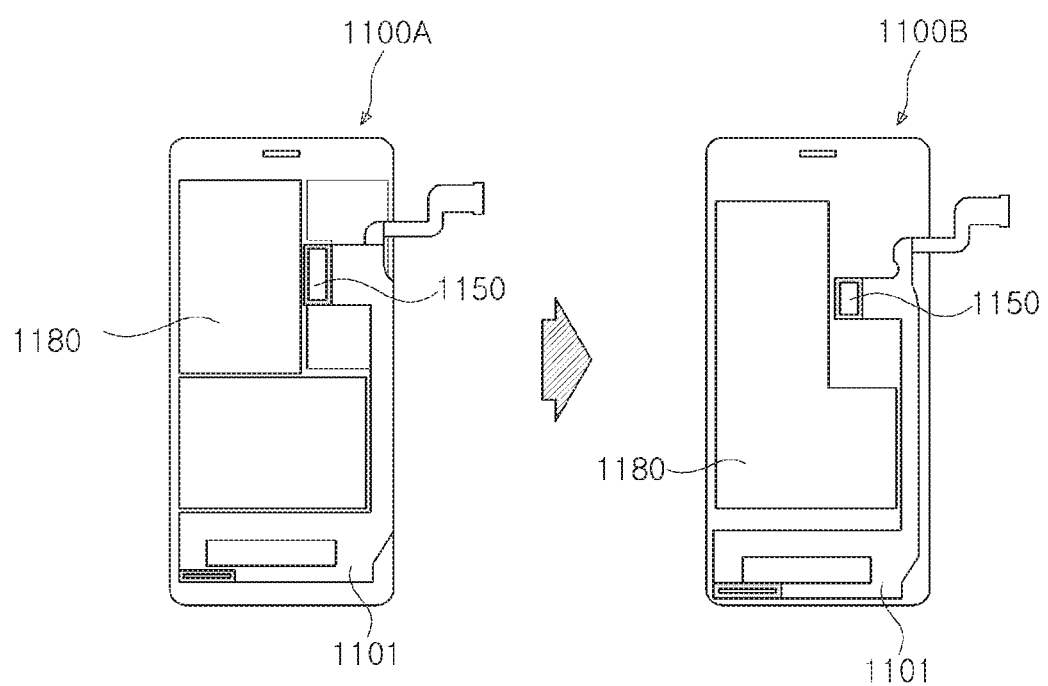
FIG. 15 is a schematic plan view illustrating an effect of applying the semiconductor package according to the disclosure to an electronic device.

FIG. 15 is a schematic plan view illustrating an effect in a case in which the semiconductor package according to the disclosure is applied to an electronic device.

Referring to FIG. 15, recently, as a size of display for mobile devices 1100A and 1100B increases, the desirability of increasing battery capacity is increasing. As the battery capacity increases, an area occupied by the battery 1180 increases. In this regard, a size of a printed circuit board 1101 such as a mainboard is advantageously reduced. Thus, due to a reduction in amounting area of a component, an area occupied by a module 1150 including a power management integrated circuit (PMIC) and passive components is gradually decreased. In this case, when the semiconductor package of any of packages 100A, 100B, 100C, and 100D according to an embodiment is applied to the module 1150, a size is able to be reduced. Thus, the area, which becomes smaller as described, above may be effectively used.

As set forth above, according to an embodiment in the present disclosure, adhesion between a metal layer and an encapsulant is improved in an upper portion of a semiconductor chip, and a semiconductor package to be manufactured in a simplified process may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a semiconductor chip having an active surface on which a connection pad is disposed and an inactive surface opposing the active surface;
an encapsulant covering at least a portion of each of the inactive surface and a side surface of the semiconductor chip;
a metal layer disposed on the encapsulant, and including a first conductive layer and a second conductive layer, sequentially stacked in direct contact with each other; and
a connection structure disposed on the active surface of the semiconductor chip, and including a first redistribution layer electrically connected to the connection pad,
wherein each of the first and second conductive layers extends to overlap, in a stacking direction of the semiconductor chip on the connection structure, with an entire upper surface of the semiconductor chip.

2. The semiconductor package of claim 1, wherein a lower surface of the first conductive layer is in contact with the encapsulant and has first surface roughness, and an upper surface of the first conductive layer is in contact with the second conductive layer and has second surface roughness smaller than the first surface roughness.

3. The semiconductor package of claim 1, wherein the first and second conductive layers are each electrically connected to a frame metal layer extending around an entire periphery of the semiconductor chip between the metal layer and the connection structure.

4. The semiconductor package of claim 3, wherein the first and second conductive layers are each electrically connected to the frame metal layer by a plurality of backside vias extending through the encapsulant and the first conductive layer to directly contact both the second conductive layer and the frame metal layer.

5. A semiconductor package, comprising:
a semiconductor chip having an active surface on which a connection pad is disposed and an inactive surface opposing the active surface;
a first encapsulant covering at least a portion of each of the inactive surface and a side surface of the semiconductor chip;
a metal layer disposed on the first encapsulant, and including a first conductive layer and a second conductive layer, sequentially stacked; and
a connection structure disposed on the active surface of the semiconductor chip, and including a first redistribution layer electrically connected to the connection pad,
wherein a lower surface of the first conductive layer is in contact with the first encapsulant and has first surface roughness, and an upper surface of the first conductive layer is in contact with the second conductive layer and has second surface roughness smaller than the first surface roughness.

6. The semiconductor package of claim 1, wherein at least a portion of the metal layer is disposed to overlap the semiconductor chip in a stacking direction of the semiconductor chip on the connection structure.

7. The semiconductor package of claim 1, wherein the second conductive layer is an electroplated layer formed using the first conductive layer as a seed layer.

8. The semiconductor package of claim 1, wherein the metal layer is electrically connected to the semiconductor chip to form a second redistribution layer.

9. The semiconductor package of claim 1, wherein the first conductive layer and the second conductive layer are formed of a same metal material.

10. The semiconductor package of claim 1, wherein the metal layer extends over an entirety of an upper surface of the first encapsulant.

11. The semiconductor package of claim 1, wherein a lower surface of the second conductive layer has the second surface roughness.

12. The semiconductor package of claim 1, wherein an upper surface of the first encapsulant has the first surface roughness.

13. The semiconductor package of claim 1, further comprising:
a frame disposed on the connection structure, and having a first through-hole in which the semiconductor chip is disposed.

14. The semiconductor package of claim 13, wherein the frame further has a second through-hole, and
the semiconductor package further comprises one or more passive components disposed in the second through-hole.

15. The semiconductor package of claim 14, further comprising:
a second encapsulant covering at least a portion of each of an upper surface and a side surface of the one or more passive components, and
wherein the first encapsulant covers an upper surface of the second encapsulant.

16. The semiconductor package of claim 13, further comprising:
a via passing through the first encapsulant to connect the metal layer to the frame.

17. The semiconductor package of claim 16, wherein the via extends through the first conductive layer to contact the second conductive layer.

18. A semiconductor package, comprising:
a semiconductor chip having an active surface on which a connection pad is disposed and an inactive surface opposing the active surface;
an encapsulant covering at least a portion of each of the inactive surface and a side surface of the semiconductor chip;
a metal layer disposed on the encapsulant, having at least a portion extended to overlap an upper portion of the semiconductor chip, and having a first conductive layer and a second conductive layer that are sequentially stacked;
a via passing through a portion of the encapsulant and connected to the metal layer; and
a connection structure disposed on the active surface of the semiconductor chip, and including a redistribution layer electrically connected to the connection pad,
wherein a lower surface of the first conductive layer is in contact with the encapsulant and has roughness along a surface of the encapsulant, and an upper surface of the first conductive layer is in contact with the second conductive layer and is flat.

19. The semiconductor package of claim 18, wherein surface roughness of an upper surface of the second conductive layer is substantially equal to surface roughness of the upper surface of the first conductive layer.

20. The semiconductor package of claim 18, further comprising:
a passivation layer covering the metal layer.

* * * * *